United States Patent
Wang

(10) Patent No.: US 8,208,872 B2
(45) Date of Patent: Jun. 26, 2012

(54) DISTORTION CORRECTION DEVICE AND METHOD FOR POWER AMPLIFIER

(75) Inventor: Wen-Shan Wang, Madou Township, Tainan County (TW)

(73) Assignee: Realtek Semiconductor Corp., Hsinchu (TW)

( * ) Notice: Subject to any disclaimer, the term of this patent is extended or adjusted under 35 U.S.C. 154(b) by 287 days.

(21) Appl. No.: 12/618,892

(22) Filed: Nov. 16, 2009

(65) Prior Publication Data

US 2010/0127774 A1    May 27, 2010

(30) Foreign Application Priority Data

Nov. 17, 2008   (TW) .............................. 97144424 A

(51) Int. Cl.
*H04B 1/06* (2006.01)
*H04K 3/00* (2006.01)
(52) U.S. Cl. ...................... 455/114.3; 455/126; 375/296
(58) Field of Classification Search ............... 455/114.3, 455/126; 375/296, 297
See application file for complete search history.

(56) References Cited

U.S. PATENT DOCUMENTS

| 6,356,744 | B1 * | 3/2002 | Zamat ........................... 455/126 |
| 7,058,369 | B1 | 6/2006 | Wright et al. |
| 2007/0273439 | A1 | 11/2007 | Lin et al. |
| 2008/0152037 | A1 | 6/2008 | Kim et al. |
| 2009/0111399 | A1 * | 4/2009 | Norris et al. ............... 455/114.3 |

FOREIGN PATENT DOCUMENTS

TW   200744305 A   12/2007

* cited by examiner

*Primary Examiner* — Lee Nguyen
(74) *Attorney, Agent, or Firm* — Volpe and Koenig, P.C.

(57) ABSTRACT

A distortion correction device and method for power amplifier are provided. The power amplifier receives an input signal and generates a first output signal. The distortion correction device includes a self-mixing mixer and an adaptive calculator. The method includes steps of: utilizing the self-mixing mixer to receive the first output signal and generate a second output signal based on the first output signal, wherein the second output signal includes a plurality of baseband components corresponding to signal spectrum of the input signal; and utilizing the adaptive calculator to perform an adaptation algorithm to generate a look-up table based on the baseband components.

18 Claims, 4 Drawing Sheets

DISTORTION CORRECTION DEVICE AND METHOD FOR POWER AMPLIFIER

FIELD OF THE INVENTION

The present invention relates to a power amplifier (PA) linearizer. More particularly, the present invention relates to an amplitude-modulation to phase-modulation (AM-PM) distortion correction of PA.

BACKGROUND OF THE INVENTION

Nowadays, orthogonal frequency duplex modulation (OFDM) technique has become the most popular modulation method, which uses power amplifier (PA) to achieve the linearization. The power amplifier in the wireless transceivers often meet the phenomenon of amplitude-modulation to phase-modulation (AM-PM) distortion, and the problems of the spectral regrowth are accordingly occurred. This spectral regrowth not only results in the difficulty to the construction of the PA in the wireless transceiver, but also reduces the performances such as transmitter mask and error vector magnitude (EVM) in the transceiver upon applying in IEEE 802.11a/b/g/n wireless local area network (WLAN) application.

A current linearization technique of power amplifier is the Cartesian feedback, where the output of the power amplifier is decomposed into quadrature phases by the feedback before it is compared with the inputs. The drawbacks lie in that the demodulator and the differential amplifier in the feedback path could increase the system complexity and the unit cost.

Another current linearization technique of power amplifier is the adaptive digital predistortion, which converts the output of the power amplifier in the downstream path to the baseband so as to obtain the amplitude and the phase error signals and the adaptively predistort input signal, thereby correct the distortions of AM-AM and AM-PM of the power amplifier. The drawbacks lie in that the bandwidth of the baseband signal would be increased and more power dissipation would be made. In addition, since different statuses exist between the calibration operation and the normal operation, the performance of the system predistortion would be reduced by the electrical mutual coupling between the up-conversion path and the down-conversion path.

It is therefore attempted by the applicant to deal with the above situation encountered in the prior art.

SUMMARY OF THE INVENTION

Accordingly, a distortion correction device and method for power amplifier are disclosed, wherein a self-mixing technique and an adaptation algorithm under the calibration operation implements a look-up table, with respect to an input signal of the power amplifier, for all amplitudes of the input signal relative to all correction amplitudes so as to use the look-up table to process the distortion correction under the normal operation with respect to the input signal prior to the input signal inputted to the power amplifier.

In accordance with the first aspect of the present invention, a distortion correction device adapted for a power amplifier is provided, the power amplifier amplifies an input signal and generates a first output signal. The distortion correction device includes: a self-mixing mixer, for mixing the first output signal with itself to generate a second output signal, wherein the second output signal includes a plurality of baseband components; and an adaptive calculator, coupled to the self-mixing mixer, for generating a reference data into a look-up table according to the plurality of baseband components; wherein the distortion of the power amplifier is corrected according to the reference data stored in the look-up table.

Preferably, the adaptive calculator amplifies the plurality of baseband components and selects one having the largest varying amount toward a negative direction versus time among the plurality of baseband components to determine a first correction amplitude accordingly so as to complete the look-up table.

Preferably, the first correction amplitude is corresponding to a first amplitude of the input signal.

Preferably, the input signal gains a distortion correction based on the look-up table before being input into the power amplifier.

Preferably, the self-mixing mixer has an input terminal coupled to an attenuator attenuating the first output signal.

Preferably, the distortion correction device further includes a connecting route coupled between the self-mixing mixer and the adaptive calculator and has a changeable gain amplifier and an analog/digital converter.

Preferably, the power amplifier has an input terminal coupled to a phase-adjusting circuit adjusting a phase of the input signal based on the look-up table.

Preferably, the distortion correction device further includes a connecting route coupled between the look-up table and the phase adjusting circuit and having a digital/analog converter and a low-pass filter.

Preferably, the phase-adjusting circuit has a varactor diode and an inductor connected to each other in parallel.

In accordance with the second aspect of the present invention, a correcting device adapted for correcting the distortion of an power amplifier is provided. The correcting device includes: a mixing unit receiving a first output signal generated by the power amplifier to generate a corresponding second output signal including a plurality of baseband components; and a data unit having a reference data corresponding to the plurality of baseband components; wherein the distortion of the power amplifier is corrected according to the reference data stored in the data unit.

Preferably, the correcting device further includes a calculating unit, wherein the correcting device is a distortion correction device coupled to the power amplifier receiving an input signal having a signal spectrum and generating an output signal being the first output signal, the second output signal is generated according to the output signal of the power amplifier, the plurality of baseband components are corresponding to the signal spectrum of the input signal of the power amplifier, the mixing unit is a self-mixing mixer, the calculating unit is an adaptive calculator, and the data unit has a look-up table constructed by the reference data.

In accordance with the third aspect of the present invention, a distortion correction method for an power amplifier is provided, and the distortion correction method includes the steps of: generating a first output signal having a plurality of baseband components by mixing a first input signal with itself; generating a look-up table based on the plurality of baseband components; and correcting the distortion of the power amplifier according to the look-up table.

Preferably, the first input signal is an output signal output from the power amplifier, and the method further includes the steps of: amplifying the plurality of baseband components; and selecting one having the largest varying amount toward a negative direction versus time among the plurality of baseband components to determine a first correction amplitude so as to complete the look-up table.

Preferably, the plurality of baseband components are corresponding to a signal spectrum of an input signal of the power amplifier and generated based on the output signal of the amplifier, the look-up table is generated by performing an adaptation algorithm, and the first correction amplitude is corresponding to a first amplitude of the input signal of the amplifier.

Preferably, the input signal of the amplifier gains a distortion correction based on the look-up table before being input into the power amplifier.

Preferably, the distortion correction method further includes a step of adjusting a phase of the input signal based on the look-up table.

Preferably, the input signal has a plurality of amplitudes with respective predetermined amplitude values.

Preferably, the baseband component having the largest varying amount toward the negative direction versus time among the plurality of baseband components has a frequency being twice as large as a baseband frequency of the first output signal.

Preferably, the distortion correction method further includes a step of attenuating the first output signal.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
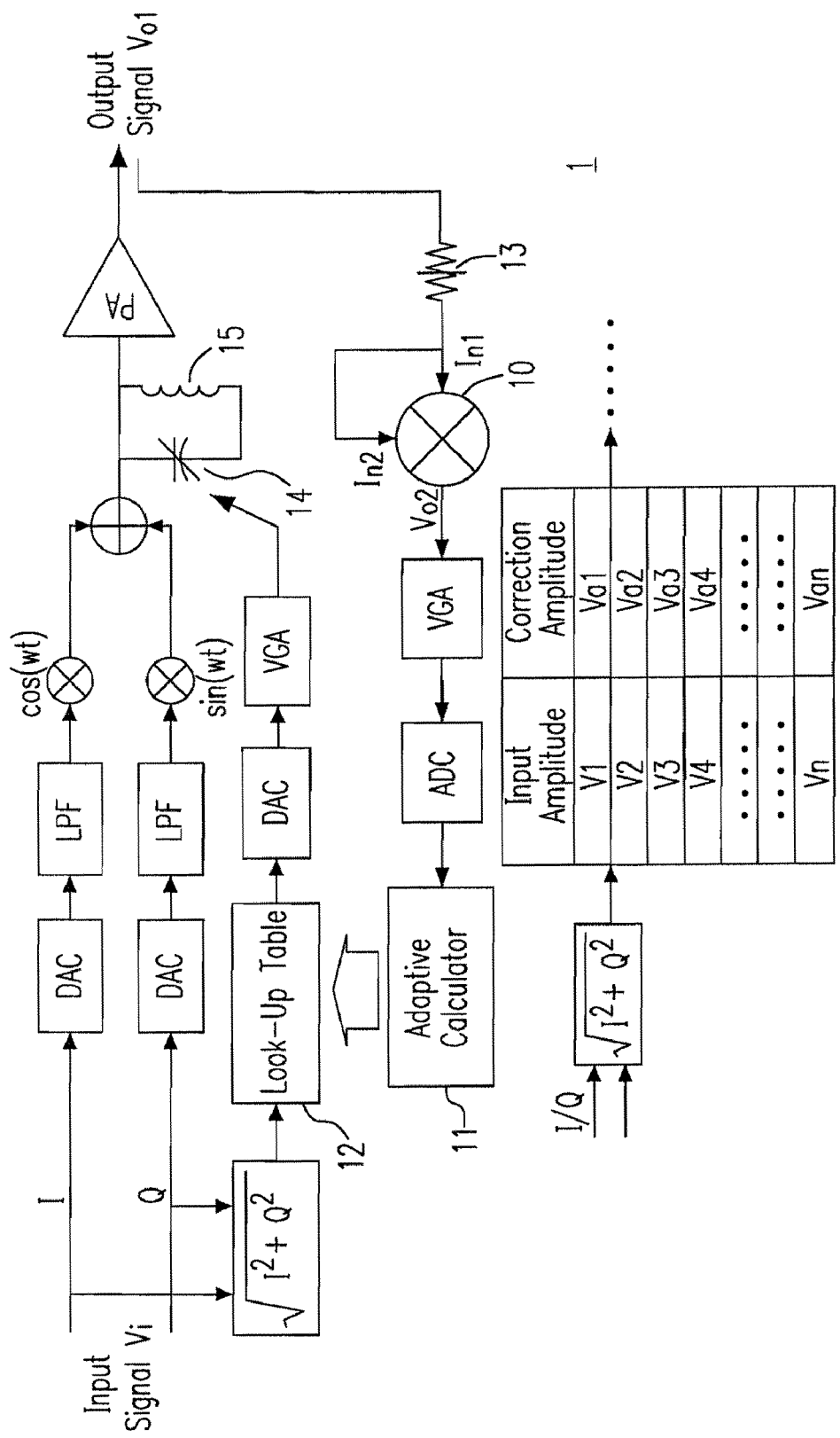
FIG. 1 illustrates a block diagram showing a distortion correction device for a power amplifier in the present invention.

Please refer to FIG. 1, which is a block diagram of a distortion correction device for a power amplifier according to the embodiment of the present invention. Under a normal operation, the in-phase component, I, and the quadrature component, Q, of the input signal respectively are converted via the digital/analog converter DAC and filtered by the low pass filter LPF, and then are amplified via the power amplifier PA to generate a output signal Vo1 after the addition. Since the amplitude-modulation to phase-modulation (AM-PM) distortion would be generated by the output Vo1, for correction of this distortion, the distortion correction is processed by using two paths with the power amplifier under a calibration operation in the present invention.

In a first path of the calibration operation, the energy of the output signal Vo1 is attenuated via an attenuator 13 and then inputted to a self-mixing mixer 10. The radio frequency (RF) signal could be converted as a direct current signal by the self-mixing mixer 10 which mixing the output signal Vo1 with output signal Vo1 itself so as to generate a output signal Vo2. The self-mixing mixer 10 is coupled to an adaptive calculator 11 through a connecting route including a variable gain amplifier VGA and an analog/digital converter. After the output signal Vo2 is amplified by the variable gain amplifier VGA and converted by the analog/digital converter, a digital signal is generated, which is inputted to an adaptive calculator 11 to perform an adaptation algorithm.

In the adaptive calculator 11, a plurality of baseband components of the signal spectrum related to a first amplitude of the digital signal would be amplified. Then, the one having the largest varying amount toward a negative direction versus time among the plurality of baseband components would be selected, whereby a first correction amplitude corresponding to the first amplitude could be determined. Afterwards, the abovementioned same process is applied with respect to all possible amplitudes, so that a look-up table with a reference data calculated by adaptive calculator 11 of all the correction amplitudes corresponding to all the amplitudes of the digital signals could be accomplished. The look-up table may be stored in a data unit.

As shown in FIG. 1, the left column of the look-up table shows all the inputted amplitudes, and the right column thereof shows the corresponding correction amplitudes. In the second path above the first path, the corresponding correction amplitude, Va2 for example, could be found in the look-up table according to the amplitude, V2 for example, of the digital signal. The distortion correction could be performed with respect to the input signal before being input to the power amplifier PA by using the corresponding value stored in the look-up table 12.

Because the look-up table is established according to the signal amplitudes, the phase-adjusting circuit arranged before the power amplifier PA in this invention is also adjusted according to the signal amplitudes. In an embodiment, a varactor diode (or varicap diode) 14 and an inductor 15 are used for constructing the phase-adjusting circuit. The phase of the input signal of the power amplifier PA could be adjusted through changing the control voltage of the varactor diode 14.

Figure 2:
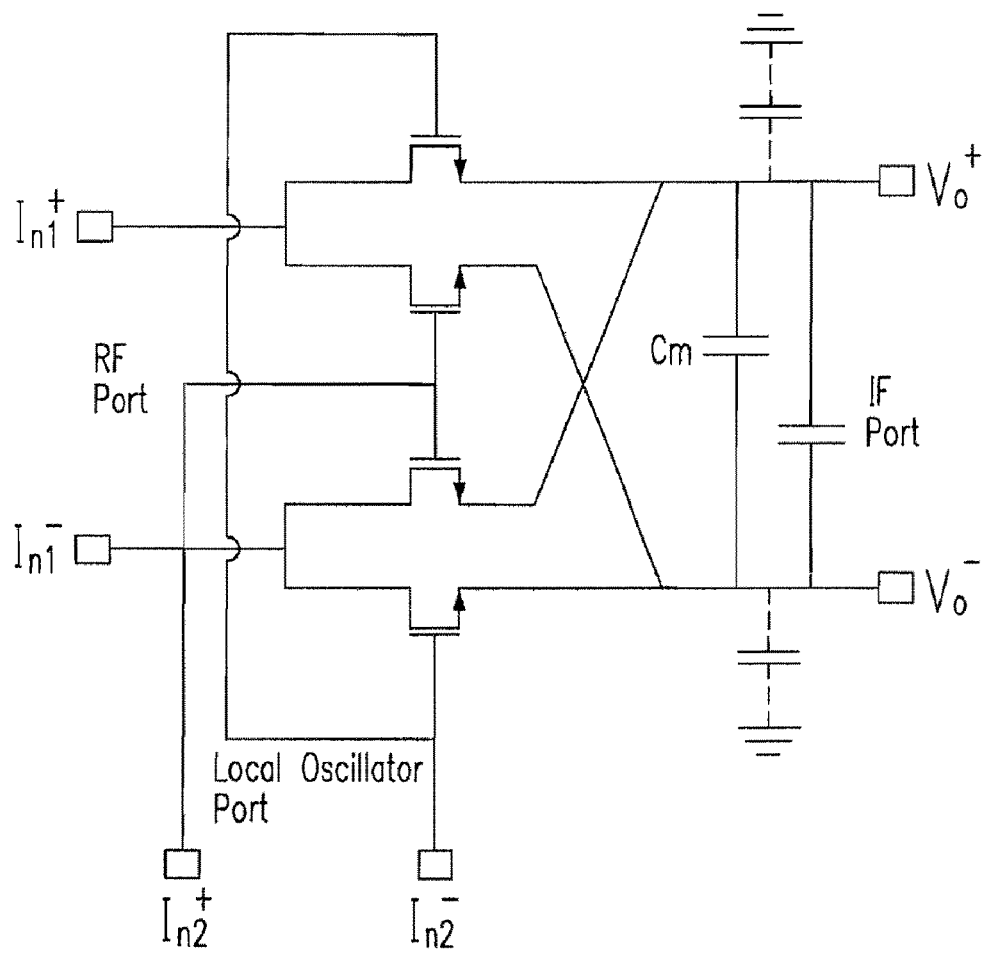
FIG. 2 illustrates a schematic diagram of the self-mixing mixer according to the embodiment in FIG. 1.

Please refer to FIG. 2, which illustrates a schematic diagram of the self-mixing mixer 10 according to the embodiment in FIG. 1, wherein the first set input signals, $In1^+$ and $In1^-$, at the RF port and the second set input signals, $In2^+$ and $In2^-$, at the local oscillator port respectively corresponds to two signals, In1 and In2, in FIG. 1. The second output signal Vo2 in FIG. 1 is composed of the positive output signal $Vo^+$ and the negative output signal $Vo^-$ cooperatively at the intermediate frequency (IF) port. To one skilled in the art, various types of the self-mixing circuits could be adopted, as long as the purpose for self-mixing in FIG. 1 could be achieved.

Figure 3:
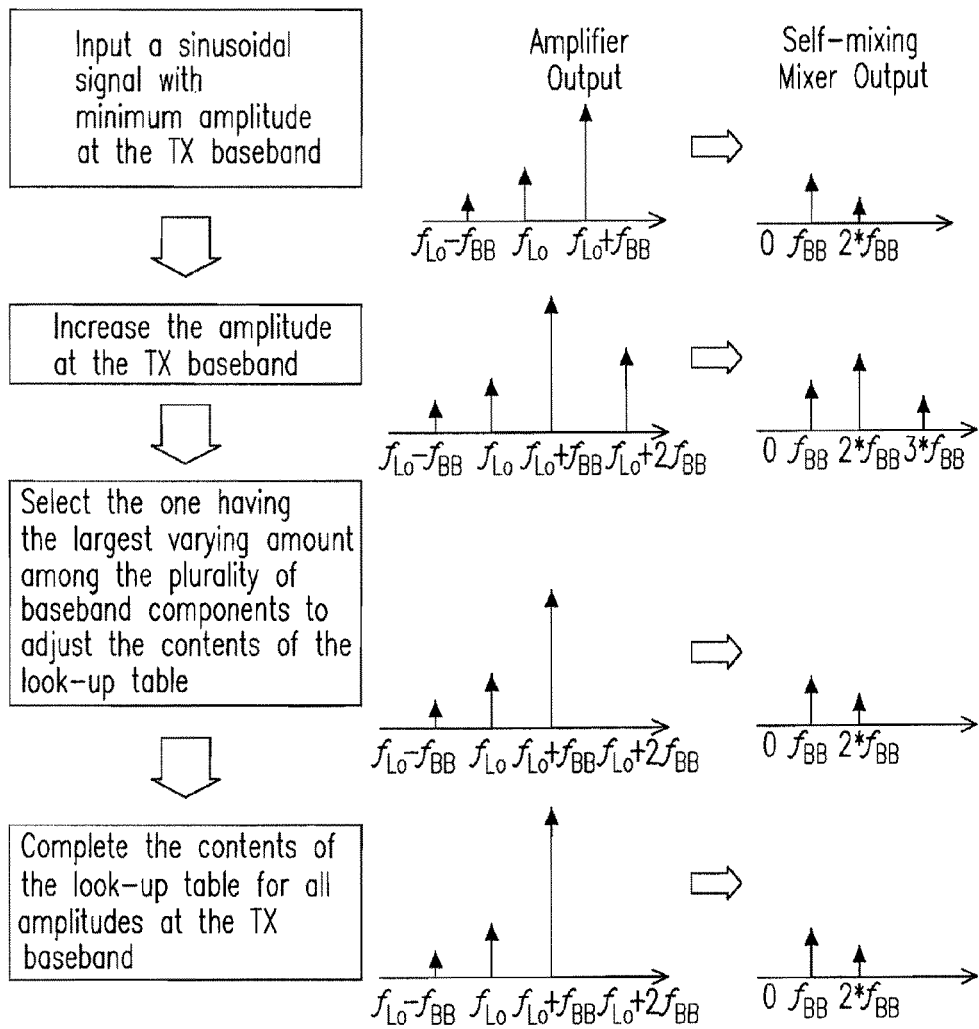
FIG. 3 illustrates a spectral illustration of an adaptation algorithm in the present invention.

Please refer to FIG. 3, which is a spectral illustration of the adaptation algorithm in the present invention. It could be found in FIG. 3 that the output signal Vo2 is outputted from the self-mixing mixer 10 after the output signal Vo1 is outputted from the power amplifier PA via the attenuator 13 and the self-mixing mixer 10 sequentially. A baseband signal f is included in the output signal Vo2 here. For establishing the look-up table 12, a sinusoidal signal with the minimum amplitude at the baseband is inputted to the self-mixing mixer 10, and then the amplitude at the baseband is amplified. By observing the baseband signal f outputted from the self-mixing mixer 10, it could be found that a maximum variance inputted from the self-mixing mixture is at the duplicate frequency of baseband, $2f_{BB}$. In the present invention, it is supposed to eliminate the duplicate frequency of baseband $2f_{BB}$. Because the duplicate frequency of baseband $2f_{BB}$ is the largest variance toward a negative direction versus time among the baseband components, the other distorted frequencies (such as the triplet frequency of baseband, $3f_{BB}$) could be simultaneously decreased if $2f_{BB}$ could be decreased.

Figure 4:
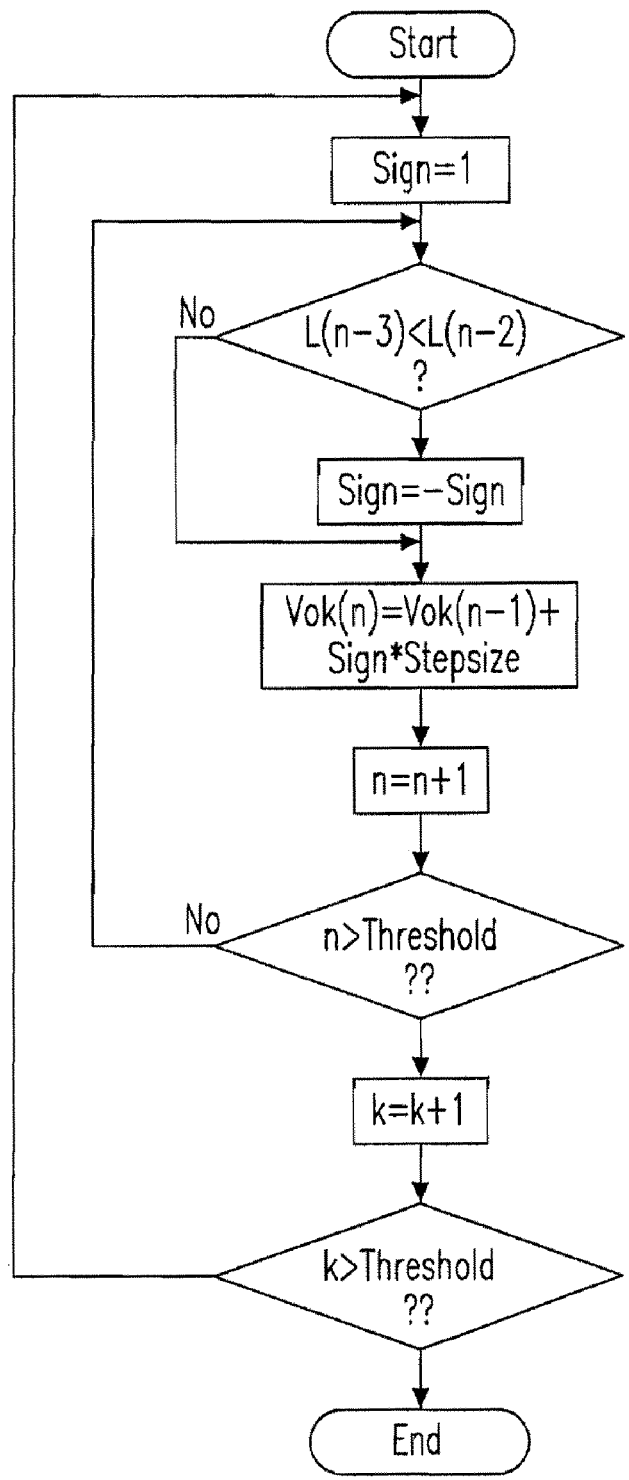
FIG. 4 illustrates a flow chart of the adaptation algorithm in the present invention.

Please refer to FIG. 4, which is a flow chart of the adaptation algorithm in the present invention, wherein "Sign" represents the selecting direction of the spectral signal, and "L(n)" represents the magnitude of the duplicate frequency of baseband, "n" is referred to time, "Vok" is referred to the k-th correction amplitude, "Stepsize" is referred to an unit increment of the correction amplitude, and "Threshold" is referred to the threshold value.

At first, a selecting direction of the spectral signal is randomly selected, and a certain correction amplitude Vok (such as k=1) is selected. Further, two duplicate frequencies of baseband L(n−3) and L(n−2) corresponding to the former and the later time points (n=1, for example) are compared. If L(n−3) is larger than L(n−2), it shows that the selecting direction of the spectral signal is correct; however, if L(n−3) is smaller than L(n−2), it shows that the selecting direction of the spectral signal is incorrect. Under this condition, the initiated selecting direction of the spectral signal "Sign" should be added a negative symbol.

Subsequently, at the correct selecting direction of the spectral signal, a unit increment of the correction amplitude "Stepsize" is added to the same correction amplitude Vok with respect to the same time point n so as to perform the adaptation algorithm.

After the adaptation algorithm for time point n=1 is completed, the same process is repeatedly performed on the same correction amplitude Vok (k=1) with respect to the next time point (n=2) until "n" exceeds the threshold value, which implies that the same correction amplitude Vok at all time points are compared. At this moment, the value k pluses 1 for repeating the same process on the next correction amplitude Vok (k=2) to complete the comparison of the same correction amplitude Vo at all time points. Similarly, when k exceeds the threshold value, it implies that all the correction amplitudes are presented, and the above-mentioned needed look-up table is accomplished.

The actuation which the normal operation is performed after the look-up table is established in the calibration operation is illustrated as following. Please refer to FIG. 1 again, when normal operation is performed, the in-phase component I and the quadrature component Q of the input signal Vi are separately calculated through the calculating unit 16 to obtain an input amplitude. Next, the same input amplitude in the look-up table 12 is looked up according to the input amplitude to obtain the corresponding amplitude value. After the correction amplitude value is converted by the digital/analog converter DAC and amplified by the variable gain amplifier VGA sequentially, the control voltage of the varactor diode 14 is changed accordingly to adjust the phase of the input signal of the power amplifier PA In conclusion, the self-mixing technique and the adaptation algorithm are used in the present invention. A look-up table of all the correction amplitudes corresponding to all the amplitudes of the input signals could be achieved with respect to an input signal of the power amplifier, so that the look-up table is applied to perform the distortion correction under normal operation with respect to the input signal before the power amplifier is inputted. The distortion correction device of the present invention not only has the lower system complexity and the unit cost, but also has the lower power dissipations.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A distortion correction device adapted for a power amplifier, the power amplifier amplifies an input signal and generates a first output signal, the distortion correction device comprising:
   a self-mixing mixer, for mixing the first output signal with itself to generate a second output signal, wherein the second output signal includes a plurality of baseband components; and
   an adaptive calculator, coupled to the self-mixing mixer, for generating a reference data into a look-up table according to the plurality of baseband components;
   wherein the distortion of the power amplifier is corrected according to the reference data stored in the look-up table.

2. The distortion correction device as claimed in claim 1, wherein the adaptive calculator amplifies the plurality of baseband components and selects one having the largest varying amount toward a negative direction versus time among the plurality of baseband components to determine a first correction amplitude accordingly so as to complete the look-up table.

3. The distortion correction device as claimed in claim 2, wherein the first correction amplitude is corresponding to a first amplitude of the input signal.

4. The distortion correction device as claimed in claim 2, wherein the input signal gains a distortion correction based on the look-up table before being input into the power amplifier.

5. The distortion correction device as claimed in claim 1, wherein the self-mixing mixer has an input terminal coupled to an attenuator attenuating the first output signal.

6. The distortion correction device as claimed in claim 1 further comprising a connecting route coupled between the self-mixing mixer and the adaptive calculator and having a changeable gain amplifier and an analog/digital converter.

7. The distortion correction device as claimed in claim 1, wherein the power amplifier has an input terminal coupled to a phase-adjusting circuit adjusting a phase of the input signal based on the look-up table.

8. The distortion correction device as claimed in claim 7 further comprising a connecting route coupled between the look-up table and the phase adjusting circuit and having a digital/analog converter and a low-pass filter.

9. The distortion correction device as claimed in claim 7, wherein the phase-adjusting circuit has a varactor diode and an inductor connected to each other in parallel.

10. A correcting device adapted for correcting the distortion of an power amplifier, comprising:
    a mixing unit receiving a first output signal generated by the power amplifier to generate a corresponding second output signal including a plurality of baseband components;
    a data unit having a reference data corresponding to the plurality of baseband components; and
    a calculating unit;
    wherein the distortion of the power amplifier is corrected according to the reference data stored in the data unit, the correcting device is a distortion correction device coupled to the power amplifier receiving an input signal having a signal spectrum and generating an output signal being the first output signal, the second output signal is generated according to the output signal of the power amplifier, the plurality of baseband components are corresponding to the signal spectrum of the input signal of the power amplifier, the mixing unit is a self-mixing mixer, the calculating unit is an adaptive calculator, and the data unit has a look-up table constructed by the reference data.

11. A distortion correction method for an power amplifier, comprising the steps of:
generating a first output signal having a plurality of baseband components by mixing a first input signal with itself;
generating a look-up table based on the plurality of baseband components; and
correcting the distortion of the power amplifier according to the look-up table.

12. The distortion correction method as claimed in claim 11, wherein the first input signal is an output signal output from the power amplifier, and the method further comprises the steps of:
amplifying the plurality of baseband components; and
selecting one having the largest varying amount toward a negative direction versus time among the plurality of baseband components to determine a first correction amplitude so as to complete the look-up table.

13. The distortion correction method as claimed in claim 12, wherein the plurality of baseband components are corresponding to a signal spectrum of an input signal of the power amplifier and generated based on the output signal of the amplifier, the look-up table is generated by performing an adaptation algorithm, and the first correction amplitude is corresponding to a first amplitude of the input signal of the amplifier.

14. The distortion correction method as claimed in claim 13, wherein the input signal of the amplifier gains a distortion correction based on the look-up table before being input into the power amplifier.

15. The distortion correction method as claimed in claim 13 further comprising a step of adjusting a phase of the input signal based on the look-up table.

16. The distortion correction method as claimed in claim 13, wherein the input signal has a plurality of amplitudes with respective predetermined amplitude values.

17. The distortion correction method as claimed in claim 12, wherein the baseband component having the largest varying amount toward the negative direction versus time among the plurality of baseband components has a frequency being twice as large as a baseband frequency of the first output signal.

18. The distortion correction method as claimed in claim 11 further comprising a step of attenuating the first output signal.

* * * * *